(12) United States Patent
Choi

(10) Patent No.: US 10,832,939 B2
(45) Date of Patent: Nov. 10, 2020

(54) SEMICONDUCTOR DEVICE AND METHOD OF FABRICATING THE SAME

(71) Applicant: Samsung Electronics Co., Ltd., Suwon-si (KR)

(72) Inventor: Hoon-Sung Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/275,899

(22) Filed: Feb. 14, 2019

(65) Prior Publication Data

US 2019/0318956 A1 Oct. 17, 2019

(30) Foreign Application Priority Data

Apr. 11, 2018 (KR) .................. 10-2018-0042179

(51) Int. Cl.
*H01L 27/12* (2006.01)
*H01L 21/762* (2006.01)
*H01L 21/84* (2006.01)

(52) U.S. Cl.
CPC ........ *H01L 21/76283* (2013.01); *H01L 21/84* (2013.01); *H01L 27/1207* (2013.01)

(58) Field of Classification Search
CPC .............. H01L 21/76283; H01L 21/84; H01L 27/1207

USPC ......................................................... 257/348
See application file for complete search history.

(56) References Cited

U.S. PATENT DOCUMENTS

| | | | |
|---|---|---|---|
| 7,018,873 B2 | 3/2006 | Dennard et al. | |
| 8,445,356 B1 | 5/2013 | Cai et al. | |
| 8,482,070 B1 | 7/2013 | Flatresse et al. | |
| 8,525,292 B2 | 9/2013 | Cheng et al. | |
| 8,598,663 B2 | 12/2013 | Cheng et al. | |
| 8,653,596 B2 | 2/2014 | Cheng et al. | |
| 9,601,511 B2* | 3/2017 | Vinet | H01L 21/76237 |
| 9,691,669 B1 | 6/2017 | Saxena et al. | |
| 2014/0015052 A1* | 1/2014 | Fenouillet-Beranger | H01L 27/1203 257/348 |
| 2016/0301404 A1 | 10/2016 | Agrawal | |

* cited by examiner

*Primary Examiner* — Tan N Tran
(74) *Attorney, Agent, or Firm* — Harness, Dickey & Pierce, P.L.C.

(57) ABSTRACT

A semiconductor comprises two transistors of the first conductivity type separated from two transistors of a second conductivity type by a first element isolation layer. Further, the two transistors of the first conductivity type are separated from each other by a second element isolation layer and the two transistors of the second conductivity type are separated from each other by a third element isolation layer. In example embodiments, the second and third element isolation layers are shallower than the first element isolation layer.

19 Claims, 12 Drawing Sheets

SEMICONDUCTOR DEVICE AND METHOD OF FABRICATING THE SAME

CROSS-REFERENCE TO RELATED APPLICATION

This application claims priority under 35 U.S.C. § 119 to Korean Patent Application No. 10-2018-0042179, filed on Apr. 11, 2018, in the Korean Intellectual Property Office, the disclosure of which is hereby incorporated by reference in its entirety.

BACKGROUND

1. Field of the Inventive Concepts

The present inventive concepts relate to a semiconductor device and a method of fabricating the same.

2. Description of the Related Art

Recent semiconductor elements have developed in a direction of enabling a higher-speed operation at lower voltage, and the fabricating process of the semiconductor element has been developed in a direction in which the degree of integration is increased. Therefore, patterns of the highly scaled highly integrated semiconductor element may be spaced at finer pitches with finer widths.

A FD-SOI (Fully Depleted Silicon On Insulator) process of forming a buried insulation layer on a substrate and forming a channel and a transistor on the buried insulation layer during the miniaturization process of the semiconductor element has been introduced. The FD-SOI process has the effect of reducing the parasitic capacitance and the leakage current by fully depleting the channel in the lower part of the transistor.

SUMMARY

An aspect of the present inventive concepts provides a semiconductor device having an FD-SOI structure.

Another aspect of the present inventive concepts provides a method of fabricating a semiconductor device having an FD-SOI structure.

According to some embodiments of the present inventive concepts, a semiconductor device comprises: a substrate; a first impurity region of a first conductivity type formed on the substrate; a second impurity region of a second conductivity type formed on the substrate to be adjacent to the first impurity region; a first semiconductor layer of the second conductivity type formed on the first impurity region; a second semiconductor layer of the first conductivity type formed on the second impurity region; a first buried insulation layer formed on the first semiconductor layer; a second buried insulation layer formed on the second semiconductor layer; a third semiconductor layer formed on the first buried insulation layer; a fourth semiconductor layer formed on the second buried insulation layer; a first transistor and a second transistor formed on the first semiconductor layer, respectively; a third transistor formed on the second semiconductor layer; a first element isolation layer which separates the second transistor and the third transistor; and a second element isolation layer which separates the first transistor and the second transistor and is formed to be shallower than the first element isolation layer.

According to some embodiments of the present inventive concepts, a semiconductor device comprises: a substrate; a first impurity region of a first conductivity type and a second impurity region of a second conductivity type in contact with each other on the substrate; a first semiconductor layer of the second conductivity type formed on the first impurity region; a second semiconductor layer of the first conductivity type formed on the second impurity region; a buried insulation layer formed on the first semiconductor layer and the second semiconductor layer; a third semiconductor layer overlapping the first semiconductor layer, and a fourth semiconductor layer overlapping the second semiconductor layer on the buried insulation layer; a first element isolation layer formed in the third semiconductor layer; and a second element isolation layer which completely separates the first semiconductor layer and the second semiconductor layer.

According to some embodiments of the present inventive concepts, a method of fabricating a semiconductor device, the method comprises: forming a first impurity region of a first conductivity type and a second impurity region of a second conductivity type adjacent to each other on a substrate; forming a buried insulation layer on the first impurity region and the second impurity region; forming a third semiconductor layer and a fourth semiconductor layer adjacent to each other on the buried insulation layer, the third semiconductor layer overlapping a first semiconductor layer, and the fourth semiconductor layer overlapping a second semiconductor layer; forming a trench formed in the first semiconductor layer and the second semiconductor layer; filling the trench to form a first element isolation layer; forming a first transistor and a second transistor on the first semiconductor layer; and forming a second element isolation layer in the third semiconductor layer to separate the first transistor and the second transistor.

According to some embodiments of the present inventive concepts, a semiconductor device comprises: a substrate; a first impurity region of a first conductivity type formed on the substrate; a second impurity region of a second conductivity type formed on the substrate to be adjacent to the first impurity region; a first semiconductor layer of the second conductivity type formed on the first impurity region; a second semiconductor layer of the first conductivity type formed on the second impurity region; a first buried insulation layer formed on the first semiconductor layer; a second buried insulation layer formed on the second semiconductor layer; a third semiconductor layer formed on the first buried insulation layer; a fourth semiconductor layer formed on the second buried insulation layer; a first transistor formed on the first semiconductor layer; a second transistor formed on the second semiconductor layer; a first element isolation layer which separates the first transistor and the second transistor; a second element isolation layer formed in the third semiconductor layer to be shallower than the first element isolation layer; and a first well contact connected to the first semiconductor layer, the first well contact not being disposed between the first transistor and the first element isolation layer.

The aspects of the present inventive concepts are not limited to those mentioned above and other aspects which are not mentioned may be clearly understood by those skilled in the art from the description below.

BRIEF DESCRIPTION OF THE DRAWINGS

The above and other aspects and features of the present inventive concepts will become more apparent by describing in detail example embodiments thereof with reference to the attached drawings, in which.

DETAILED DESCRIPTION OF EXAMPLE EMBODIMENTS

Hereinafter, a semiconductor device and a method of fabricating the same according to an embodiment of the present inventive concepts will be described with reference to FIGS. 1 to 12.

Figure 1:
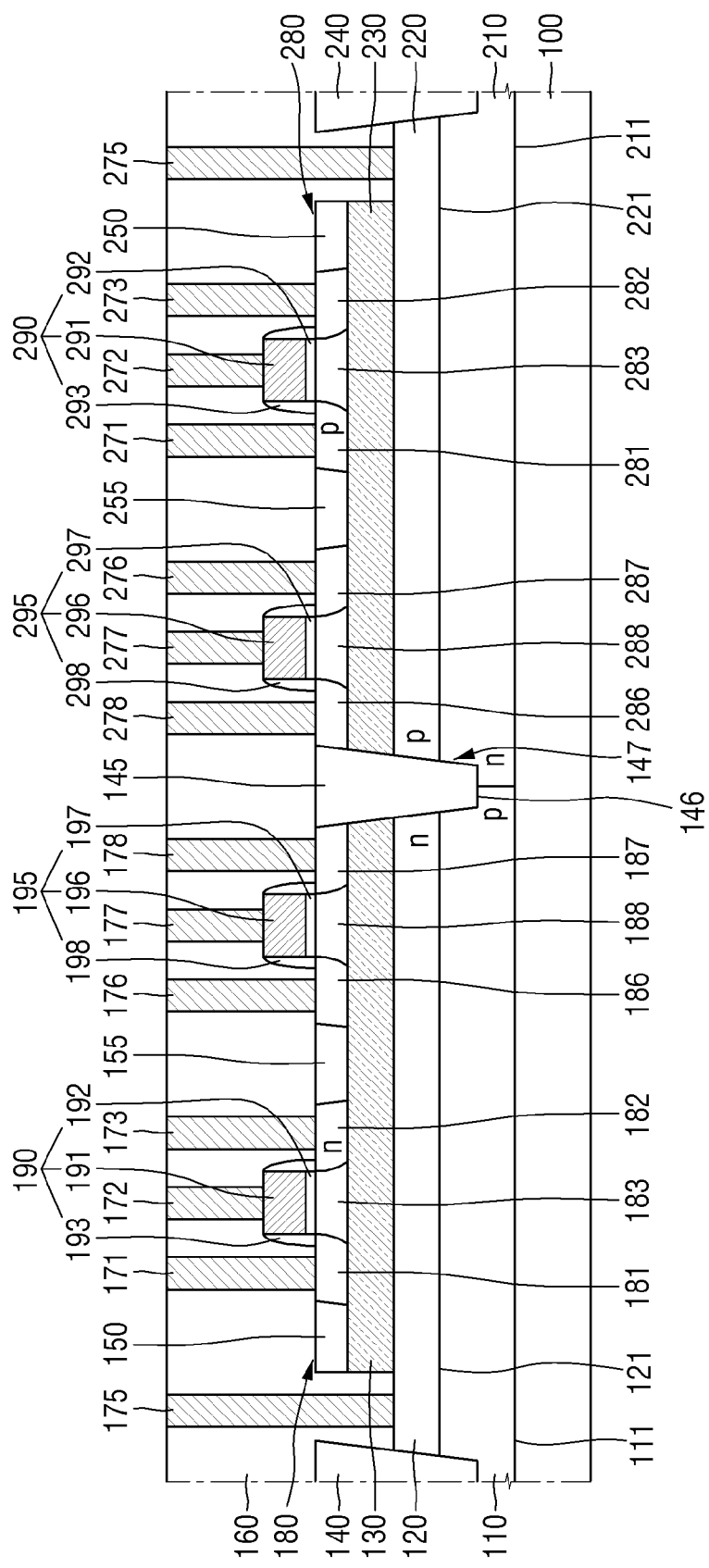
FIG. 1 is a cross-sectional view illustrating a semiconductor device according to some embodiments of the present inventive concepts.

FIG. 1 is a cross-sectional view illustrating a semiconductor device according to some embodiments of the present inventive concepts.

Referring to FIG. 1, the semiconductor device according to some embodiments of the present inventive concepts may include a substrate 100, a first impurity region 110 of a first conductivity type, a second impurity region 210 of a second conductivity type, a first semiconductor layer 120 of the second conductivity type, a second semiconductor layer 220 of the first conductivity type, a first buried insulation layer 130 and a second buried insulation layer 230, a third semiconductor layer 180, a fourth semiconductor layer 280, first to fourth transistors, and/or contacts 171, 172, 173, 175, 176, 177, 178, 271, 272, 273, 275, 276, 277, and 278.

In some embodiments of the present inventive concepts, the first transistor may include a first gate structure 190, a first source region 181, a first drain region 182, and/or a first channel region 183. The first gate structure 190 may include a first gate electrode 191, a first gate insulation layer 192, and/or a first gate spacer 193. Similarly, the second to fourth transistor according to some embodiments of the present inventive concepts may include second to fourth gate structures 195, 290 and 295, second to fourth source regions 186, 281 and 286, second to fourth drain regions 187, 282 and 287, and/or second to fourth channel regions 188, 283 and 287, respectively. The second to fourth gate structures 195, 290 and 295 may include second to fourth gate electrodes 196, 291 and 296, second to fourth gate insulation layers 197, 292 and 297, and/or second to fourth gate spacer 198, 293 and 298, respectively.

The semiconductor device according to some embodiments of the present inventive concepts may have a CMOS (Complementary Metal Oxide Semiconductor) configuration in which an N-type transistor and a P-type transistor are connected to each other.

For example, the first transistor and the second transistor may be the N-type transistors, and the third transistor and the fourth transistor may be the P-type transistors. However, the inventive concepts are not limited thereto. Hereinafter, the semiconductor device including the first transistor to the fourth transistor will be described in more detail.

The substrate 100 may be an SOI (Semiconductor On Insulator) substrate having an insulation layer formed on a silicon substrate. In other words, the first semiconductor layer 120 and the third semiconductor layer 180 inside the substrate 100 may be divided by the first buried insulation layer 130. In some embodiments of the present inventive concepts, a substrate 100 may be formed by bonding a wafer including the third semiconductor layer 180 onto the first buried insulation layer 130 formed on the first semiconductor layer 120.

First element isolation layers 140, 145 and 240 may be formed in the substrate 100. The first element isolation layers 140, 145 and 240 may define an active region in the substrate.

As illustrated in FIG. 1, the first element isolation layer 145 may distinguish two active regions in the substrate 100. The first impurity region 110 and the second impurity region 210, the first buried insulation layer 130 and the second buried insulation layer 230, the first semiconductor layer 120 and the second semiconductor layer 220, and the third semiconductor layer 180 and the fourth semiconductor layer 280 may be distinguished by the first element isolation layer 145. Further, the first element isolation layer 145 may distinguish between the second transistor and the fourth transistor.

The first element isolation layer 145 may fill the trench 147 formed in the substrate 100. The height of the lowermost part 146 of the first element isolation layer 145 may be higher than the lowermost parts 111 and 211 of the first impurity region 110 or the second impurity region 210, and may be lower than the lowermost parts 121 and 221 of the first semiconductor layer 120 or the second semiconductor layer 220.

The first element isolation layers 140, 145 and 240 may be formed of, for example, STI (Shallow Trench Isolation) or LOCOS (Local Oxidation of Silicon) and the like, but the present inventive concepts are not limited thereto.

The first impurity region 110 and the second impurity region 210 may be formed in the substrate 100. The first impurity region 110 and the second impurity region 210 may be formed to have conductivity types different from each other. Specifically, the first impurity region 110 may have a first conductivity type, and the second impurity region 210 may have a second conductivity type.

Therefore, as illustrated in FIG. 1, the first impurity region 110 may be formed of a P-type and the second impurity region 210 may be formed of an N-type, but is not limited thereto. Conversely, the first impurity region 110 may be formed of an N-type and the second impurity region 210 may be formed of a P-type.

As illustrated, the lowermost part 111 of the first impurity region 110 and the lowermost part 211 of the second impurity region 210 may be located to be lower than the lowest part 146 of the first element isolation layer 145. Therefore, the first impurity region 110 and the second impurity region 210 may not be completely separated by the first element isolation layer 145. Parts of the first impurity region 110 and the second impurity region 210 may be in contact with each other. A kind of PN junction may be formed between the first impurity region 110 and the second impurity region 210.

Here, the expression "being in contact with each other" means that no other constituent element is interposed between the first impurity region 110 and the second impurity region 210.

The first semiconductor layer 120 may be formed on the first impurity region 110. The first semiconductor layer 120 may have a second conductivity type, and may be, for example, an N-type as illustrated in FIG. 1. Since the first impurity region 110 of the semiconductor device according to some embodiments of the present inventive concepts have the first conductivity type, the impurity region 110 and the first semiconductor layer 120 may have conductivity types opposite to each other.

As illustrated in FIG. 1, the first impurity region 110 and the second impurity region 210 may not be in contact with the contacts 171, 172, 173, 175, 176, 177, 178, 271, 272, 273, 275, 276, 277, and/or 278. The first impurity region 110 and the second impurity region 210 may be maintained in a floating state, without application of another voltage by the contacts 171, 172, 173, 175, 176, 177, 178, 271, 272, 273, 275, 276, 277, and/or 278, but the present inventive concepts are not limited thereto.

The second semiconductor layer 220 may be formed on the second impurity region 210. The second semiconductor layer 220 may have a first conductivity type, and may be, for example, a p-type as illustrated in FIG. 1. Since the second impurity region 210 of the semiconductor device according to some embodiments of the present inventive concepts have the second conductivity type, the second impurity region 210 and the second semiconductor layer 220 may have conductivity types opposite to each other.

The first semiconductor layer 120 and the second semiconductor layer 220 may be completely separated by the first element isolation layer 145. The first semiconductor layer 120 and the second semiconductor layer 220 may not be in contact with each other. Therefore, the first semiconductor layer 120 and the second semiconductor layer 220 may be electrically insulated from each other.

The lowermost part 121 of the first semiconductor layer 120 and the lowermost part 221 of the second semiconductor layer 220 may be located above the lowermost part 146 of the first element isolation layer 145.

The first semiconductor layer 120 and the second semiconductor layer 220 may function as a body region in the semiconductor device according to some embodiments of the present inventive concepts. For example, the first semiconductor layer 120 may form a common body region between the first transistor and the second transistor. The second semiconductor layer 220 may form a common body region between the third transistor and the fourth transistor.

Therefore, the first transistor and the second transistor may share the first semiconductor layer 120 as the body region. When a body bias voltage is applied to the first semiconductor layer 120 via a first well contact 175, the first transistor and the second transistor may have a common body bias.

The third transistor and the fourth transistor may share the second semiconductor layer 220 as the body region. Likewise, when a body bias voltage is applied to the second semiconductor layer 220 via the second well contact 275, the third transistor and the fourth transistor may have a common body bias.

The body bias voltage is applied to the first and second transistors sharing the first semiconductor layer 120 as the body region by the single well contact e.g. first well contact 175. Therefore, the area occupied by the first transistor and the second transistor may be reduced. This may also be applied to the case of the third and fourth transistors to which the body bias voltage is applied by the second well contact 275.

The first buried insulation layer 130 may be formed on the first semiconductor layer 120. The first buried insulation layer 130 may include at least one of silicon oxide ($SiO_2$), silicon nitride (SiN), silicon oxynitride (SiON), and combinations thereof, but the present inventive concepts are not limited thereto. The first buried insulation layer 130 may insulate between the first semiconductor layer 120 and the third semiconductor layer 180.

The second buried insulation layer 230 may be formed on the second semiconductor layer 220. As will be described later, the second buried insulation layer 230 may be formed integrally with the first buried insulation layer 130. Therefore, the second buried insulation layer 230 may include the same material as the first buried insulation layer 130.

The first buried insulation layer 130 and the second buried insulation layer 230 may be separated by the first element isolation layer 145. Therefore, the first buried insulation layer 130 and the second buried insulation layer 230 may not be in contact with each other.

The third semiconductor layer 180 may be formed on the first buried insulation layer 130. The third semiconductor layer 180 may have a second conductivity type, and may be, for example, an N-type as illustrated in FIG. 1. Since the first impurity region 110 of the semiconductor device according to some embodiments of the present inventive concepts have the first conductivity type, the first impurity region 110 and the third semiconductor layer 180 have conductivity types opposite to each other. In some embodiments, since the first semiconductor layer 120 has a second conductivity type, the third semiconductor layer 180 has the same conductivity type as the first semiconductor layer 120.

The third semiconductor layer 180 may include first and second source regions 181 and 186, first and second drain regions 182 and 187, and first and second channel regions 183 and 188. Each of the first source region 181 and the first drain region 182 may function as the source and drain of the first transistor. The second source region 186 and the second drain region 187 may function as the source and the drain of the second transistor, respectively.

Unlike the configuration illustrated in FIG. 1, in some embodiments of the inventive concepts, at least some parts of the first and second source region 181, 186 and the first and second drain region 182, 187 may have a structure which protrudes upward from the upper surface of the third semiconductor layer 180.

The fourth semiconductor layer 280 may include third and fourth source regions 281 and 286, third and fourth drain regions 282 and 287, and third and fourth channel regions 283 and 288.

The second element isolation layers 150 and 155 may be formed on the first buried insulation layer 130. The second element isolation layer 155 may be formed between the first drain region 182 of the first transistor and the second source region 186 of the second transistor. Therefore, the second element isolation layer 155 may separate the first transistor and the second transistor from each other.

The second element isolation layers 150 and 155 may be formed by, for example, STI (Shallow Trench Isolation), LOCOS (Local Oxidation of Silicon) and the like, but the present inventive concepts are not limited thereto.

Contrary to the configuration in which the first element isolation layers 140 and 145 extend into the first or second impurity region 110, 210, the second element isolation layers 150 and 155 may extend to the upper surface of the buried insulation layer 130. Therefore, the depth from the upper surface of the second element isolation layers 150 and 155 to the lower surface of the second element isolation layers 150 and 155 may be smaller than the depth from the upper surface of the first element isolation layers 140 and 145 to the lower surfaces of the first element isolation layers 140 and 145. That is, the second element isolation layers 150 and 155 may be formed to be shallower than the first element isolation layers 140 and 145.

Further, as compared with the configuration in which the first element isolation layer 145 separates the second transistor and the third transistor of different conductivity types, the second element isolation layer 155 may separate the first transistor and the second transistor of the same conductivity type from each other.

The third element isolation layers 250 and 255 may be formed on the second buried insulation layer 230. The third element isolation layer 255 may be formed between the third source region 281 of the third transistor and the fourth drain region 287 of the fourth transistor. Therefore, the third element isolation layer 255 may separate the third transistor and the fourth transistor having the same conductivity type from each other.

The third element isolation layers 250 and 255 may be formed to be substantially the same as the second element isolation layers 150 and 155. Therefore, the third element isolation layers 250 and 255 may be formed by, for example, STI (Shallow Trench Isolation), LOCOS (Local Oxidation of Silicon) or the like, but the present inventive concepts are not limited thereto. Further, the third element isolation layers 250 and 255 may be formed to be shallower than the first element isolation layers 140, 145 and 240.

The contacts 171, 172, 173, 175, 176, 177, 178, 271, 272, 273, 275, 276, 277, and 278 may be formed in the interlayer insulation layer 160. Among the contacts illustrated in FIG. 1, a first well contact 175 and a second well contact 275 may be included.

The first well contact 175 may be formed on the first semiconductor layer 120. The lower surface of the first well contact 175 may be in contact with the upper surface of the first semiconductor layer 120. The first well contact 175 may include a conductive material. For example, these conductive materials may include at least one of polycrystalline silicon, a metal silicide compound, a conductive metal nitride, and a metal, but the present inventive concepts are not limited thereto.

The second well contact 275 may be formed on the second semiconductor layer 220. The lower surface of the second well contact 275 may be in contact with the upper surface of the second semiconductor layer 220. The second well contact 275 may include a conductive material.

Since a body bias voltage is applied to the first semiconductor layer 120 and the second semiconductor layer 220 through the first and second well contacts 175 and 275, threshold voltage, saturation voltage and/or leakage current of the semiconductor device according to some embodiments of the present inventive concepts may be controlled.

For example, when a forward body bias (FBB) voltage is applied to the first semiconductor layer 120 via the first well contact 175, it is possible to speed up the flow of the saturation current of the semiconductor device according to some embodiments of the present inventive concepts, and thus, when the gate voltage decreases, the power consumption may be reduced.

On the contrary, when a reverse body bias (RBB) voltage is applied to the first semiconductor layer 120 via the first well contact 175, the leakage current of the semiconductor device according to some embodiments of the present inventive concepts may be decreased.

Even when the forward body bias and the reverse body bias is applied to the second semiconductor layer 220 via the second well contact 275, the above-described effect of the semiconductor device may be achieved.

The first channel region 183 may serve as a movement route of electrons from the first source region 181 to the first drain region 182, depending on whether or not a turn-on voltage is applied to the first transistor.

Since the semiconductor device according to some embodiments of the present inventive concepts has a structure of FD-SOI, the depth of the channel formed in the first channel region 183 may be small. Therefore, when the turn-on voltage of the first transistor is applied, the channel formed in the first channel region 183 may be fully depleted. Therefore, the semiconductor device according to some embodiments of the present inventive concepts may reduce or prevent the occurrence of a short channel effect at the time of operation.

The second to fourth channel regions 188, 283 and 288 of the second to fourth transistors may also be formed to be substantially the same as the first channel region 183. Therefore, the second to fourth transistors may form a completely depleted channel at the time of the turn-on operation.

Source contacts 171 and 176 may be formed on the first source region 181 and the second source region 186, respectively. A source voltage may be applied to the first and second source regions 181 and 186 through the source contacts 171 and 176, respectively. Although not illustrated in FIG. 1, in some embodiments of the present inventive concepts, a silicide film is formed on the top of the first and second source regions 181 and 186, and the resistance between first and second source regions 181 and 186 and between the source contacts 171 and 176 may be decreased, but the inventive concepts are not limited thereto.

The source contacts 171 and 176 may include a conductive material. For example, these conductive materials may include at least one of polycrystalline silicon, a metal silicide compound, a conductive metal nitride, and a metal, but the present inventive concepts are not limited thereto.

Drain contacts 173 and 178 may be formed on the first drain region 182 and the second drain region 187. A drain voltage may be applied to the first and second drain regions 182 and 187 via the drain contacts 173 and 178. Likewise, in some embodiments of the present inventive concepts, a silicide film is formed on the top of the first and second drain regions 182 and 187, and the resistance between the first and second drain regions 182 and 187 the drain contacts 173 and 178 can be reduced.

The drain contacts 173 and 178 may include a conductive material. For example, such a conductive material may include at least one of polycrystalline silicon, a metal silicide compound, a conductive metal nitride, and a metal, but the present inventive concepts are not limited thereto.

The first gate electrode 191 may be formed to fill a trench defined by the first gate spacer 193 and the first gate insulation layer 192. The first gate electrode 191 may include a material having a high conductivity.

For example, the first gate electrode 191 may include, but is not limited to, at least one of polycrystalline silicon (poly Si), amorphous silicon (a-Si), titanium (Ti), titanium nitride (TiN), tungsten nitride (WN), titanium aluminum (TiAl), titanium aluminum nitride (TiAlN), tantalum nitride (TaN), titanium carbide (TiC), tantalum carbide (TaC), tantalum carbonitride (TaCN), tantalum silicon nitride (TaSiN), tantalum (Ta), cobalt (Co), ruthenium (Ru), aluminum (Al) and tungsten (W).

A gate contact 172 may be formed on the first gate electrode 191. A gate voltage may be applied to the first gate electrode 191 via the gate contact 172. The gate contact 172 may include a conductive material. For example, such a conductive material may include at least one of polycrystalline silicon, a metal silicide compound, a conductive metal nitride, and a metal, but the present inventive concepts are not limited thereto.

The first gate insulation layer 192 may be formed between the first gate electrode 191 and the third semiconductor layer 180. Specifically, the first gate insulation layer 192 may be formed on the first channel region 183 of the third semiconductor layer 180.

The first gate insulation layer 192 may include silicon oxide, silicon oxynitride, silicon nitride, a high-k material having a higher dielectric constant than and silicon oxide. The high-k material may include, but is not limited, for example, one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The first gate spacer 193 may be formed on sidewalls of the first gate electrode 191 and the first gate insulation layer 192. The first gate spacer 193 may include, but is not limited to, for example, at least one of silicon nitride, silicon oxynitride, silicon oxide, silicon oxycarbonitride (SiOCN), and combinations thereof. Although not illustrated, in some embodiments of the present inventive concepts, an interface film may be interposed between the first gate insulation layer 192 and the first channel region 183.

In some embodiments of the present inventive concepts, the first to fourth gate structures 190, 195, 290, and 295 may be formed, but is not limited to, via a gate first process as illustrated in FIG. 1. The first to fourth gate structures 190, 195, 290, and 295 may also be formed via a replacement process or a gate last process.

An interlayer insulation layer 160 may be formed to cover the first to fourth gate structures 190, 195, 290, and 295. The interlayer insulation layer 160 may include, for example, at least one of silicon oxide, silicon nitride, silicon oxynitride and a low dielectric constant material having a dielectric constant lower than silicon oxide. The low dielectric constant material may include, but is not limited to, for example, FOX (Flowable Oxide), TOSZ (Torene SilaZene), USG (Undoped Silica Glass), BSG (Borosilica Glass), PSG (PhosphoSilica Glass), BPSG (Boro Phospho Silica Glass), PETEOS (Plasma Enhanced Tetra Ethyl Ortho Silicate), FSG (Fluoride Silicate Glass), CDO (Carbon Doped Silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, or a combination thereof.

Since the second to fourth gate electrodes 196, 291, and 296, the second to fourth gate insulation layers 197, 292, and 297, and the second to fourth gate spacers 198, 293, and 298 constituting the second to fourth gate structures 195, 290, and 295 may be formed in the way similar to the first gate electrode 191, the first gate insulation layer 192, and the first gate spacer 193 of the first gate structure 190, the description thereof will not be provided.

Figure 2:
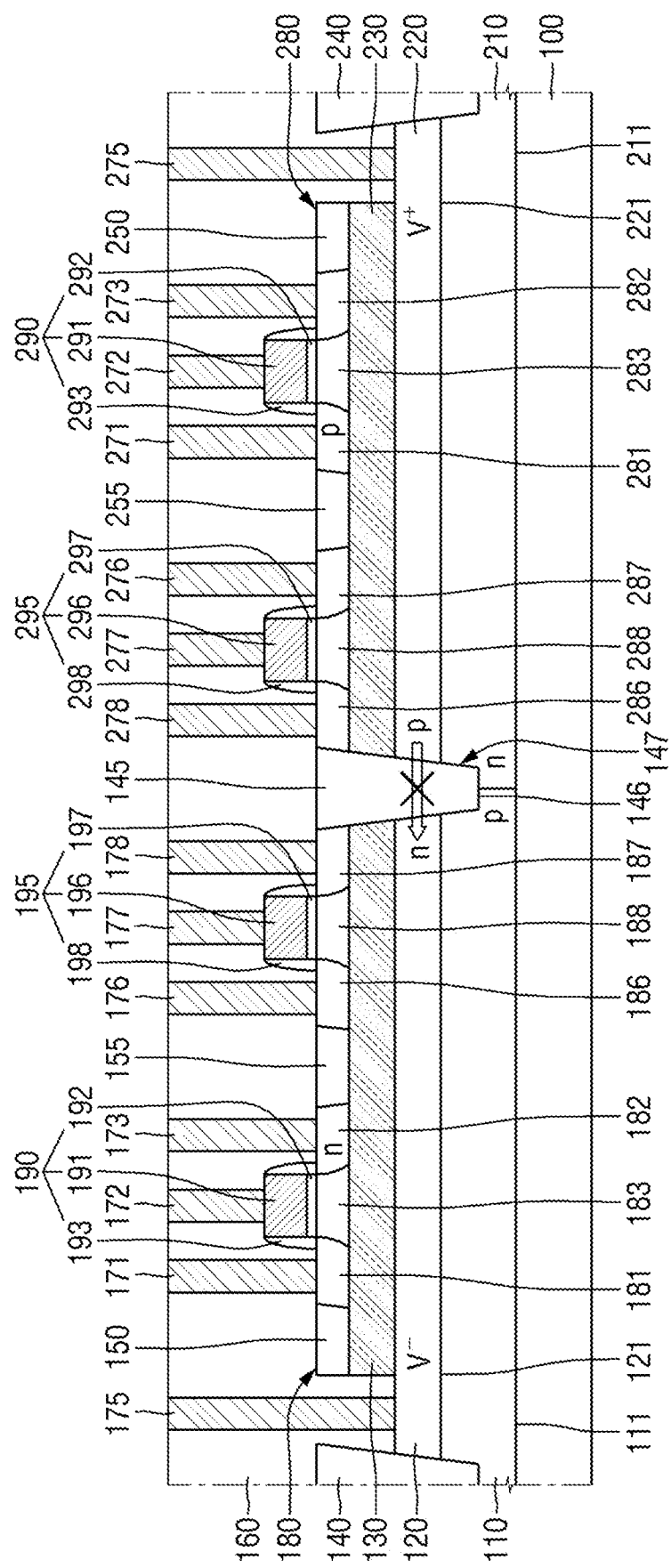
FIG. 2 is a cross-sectional view illustrating the operation of the semiconductor device of FIG. 1.

FIG. 2 is a cross-sectional view for explaining the operation of the semiconductor device of FIG. 1.

Referring to FIG. 2, a first body bias voltage (V−) may be applied to the first semiconductor layer 120 by the first well contact 175 formed on the first semiconductor layer 120. Also, a second body bias voltage (V+) greater than the first body bias voltage (V−) may be applied to the second semiconductor layer 220 by the second well contact 275 formed on the second semiconductor layer 220.

In the semiconductor device according to some embodiments of the present inventive concepts, even when the second body bias voltage (V+) applied to the second semiconductor layer 220 is higher than the first body bias voltage (V−) applied to the first semiconductor layer 120, a forward bias is not formed between the second semiconductor layer 220 and the first semiconductor layer 120.

The reason is that, as described above, the first semiconductor layer 120 and the second semiconductor layer 220 are completely separated by the first element isolation layer 145. Therefore, no forward bias is formed between the second semiconductor layer 220 and the first semiconductor layer 120 electrically separated from each other.

As a result, the magnitude of the body bias voltage applied to the first semiconductor layer 120 may not be limited by the magnitude of the body bias voltage applied to the second semiconductor layer 220.

The body bias voltage applied to the first semiconductor layer 120 and the second semiconductor layer 220 in the semiconductor device according to some embodiments of the present inventive concepts may be freely applied within a range in which the body bias voltage causes a hot carrier injection (HCl) phenomenon on the first buried insulation layer 130 and the second buried insulation layer 230 or does not exceed a breakdown voltage.

In some embodiments of the present inventive concepts, the first semiconductor layer 120, the first buried insulation layer 130 and the third semiconductor layer 180 may constitute a capacitor. For example, when the first voltage is applied to the first semiconductor layer 120 via the first well contact 175 and the second voltage is applied to the third semiconductor layer 180 via the source contact 171 or the drain contact 173, the first buried insulation layer 130 functions as a dielectric and electric charges may be charged.

Figure 3:
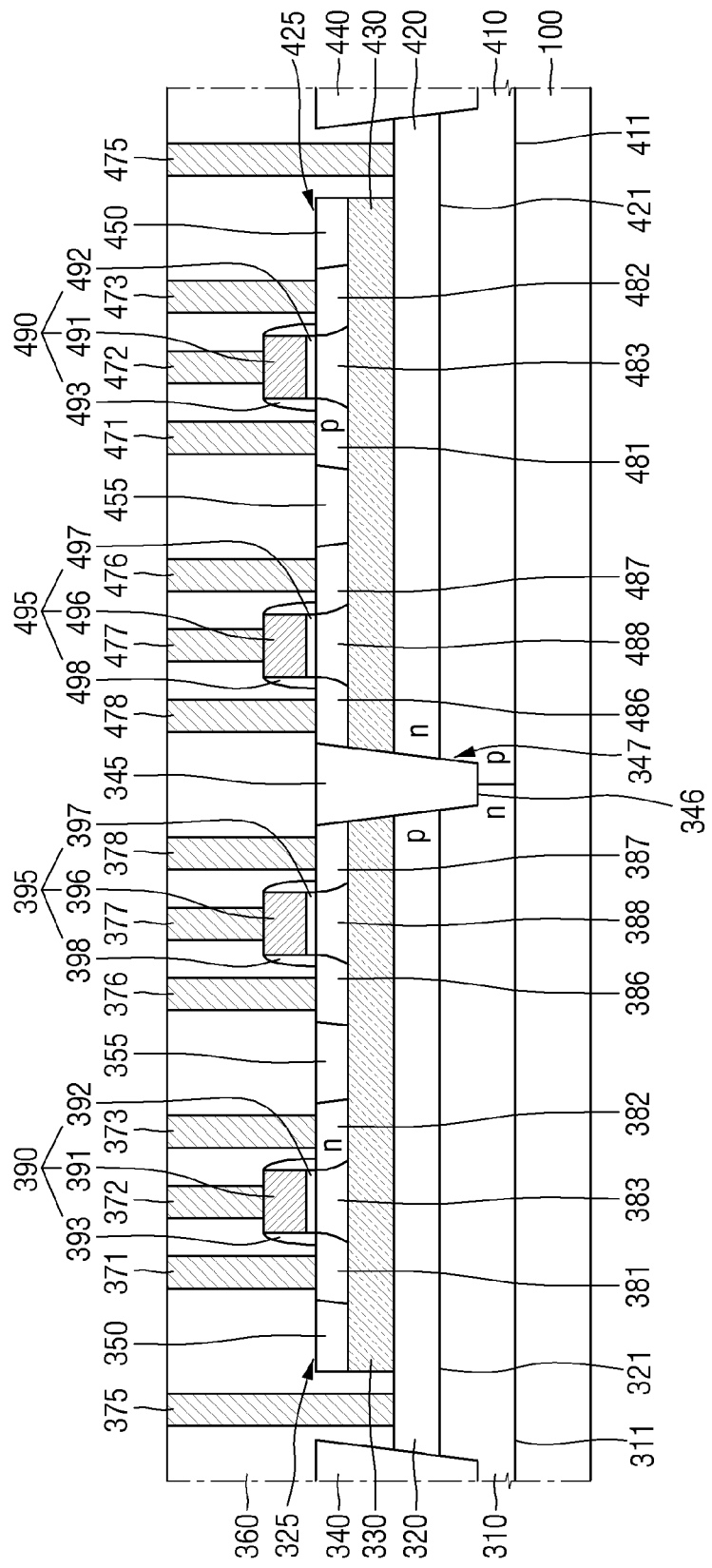
FIG. 3 is a cross-sectional view illustrating a semiconductor device according to some embodiments of the present inventive concepts.

FIG. 3 is a cross-sectional view illustrating a semiconductor device according to some embodiments of the present inventive concepts.

Referring to FIG. 3, a semiconductor device according to some embodiments of the present inventive concepts may include a substrate 100, a first impurity region 310 of a second conductivity type, a second impurity region 410 of a first conductivity type, a first semiconductor layer 320 of the first conductivity type, a second semiconductor layer 420 of the second conductivity type, a first buried insulation layer 330 and a second buried insulation layer 430, a third semiconductor layer 325, a fourth semiconductor layer 425, first to fourth transistors, and/or contacts 371, 372, 373, 375, 376, 377, 378, 471, 472, 473, 475, 476, 477, and 478.

In some embodiments of the present inventive concepts, the first transistor may include a first gate structure 390, a first source region 381, a first drain region 382, and/or a first channel region 383. The first gate structure 390 may include a first gate electrode 391, a first gate insulation layer 392, and/or a first gate spacer 393. Similarly, the second to fourth transistor according to some embodiments of the present inventive concepts may include second to fourth gate structures 395, 490 and 495, second to fourth source regions 386, 481 and 486, second to fourth drain regions 387, 482 and 487, and/or second to fourth channel regions 388, 483 and 487, respectively. The second to fourth gate structures 395, 490 and 495 may include second to fourth gate electrodes 396, 491 and 496, second to fourth gate insulation layers 397, 492 and 497, and/or second to fourth gate spacer 398, 493 and 498, respectively.

The first impurity region 310, the first semiconductor layer 320, the first buried insulation layer 330, and the third semiconductor layer 325 may be substantially the same as the first impurity region 110, the first semiconductor layer 120, the first buried insulation layer 130 and the third semiconductor layer 180 described referring to FIG. 1.

The first impurity region 310 and the third semiconductor layer 325 may have the same second conductivity type, and the first semiconductor layer 320 may have the first conductivity type. For example, as illustrated in FIG. 3, the first impurity region 310 and the third semiconductor layer 325 may be a N-type, the first semiconductor layer 320 may be a P-type.

The second impurity region 410, the second semiconductor layer 420, the second buried insulation layer 430, and the fourth semiconductor layer 425 may be substantially the same as the second impurity region 210, the second semiconductor layer 220, the second buried insulation layer 230 and the fourth semiconductor layer 280 of the semiconductor device described referring to FIG. 1.

The second impurity region 410 and the fourth semiconductor layer 425 may have the same first conductivity type, and the second semiconductor layer 420 may have the second conductivity type. For example, as illustrated in FIG. 3, the second impurity region 410 and the fourth semiconductor layer 425 may be a P-type and the second semiconductor layer 420 may be a N-type.

The lowermost part 311 of the first impurity region 310 and the lowermost part 411 of the second impurity region 410 may be located below the lowermost part 346 of the first element isolation layer 345.

The first semiconductor layer 320 and the second semiconductor layer 420 may be completely separated by the first element isolation layer 345. The first semiconductor layer 320 and the second semiconductor layer 420 may not be in contact with each other. Therefore, the first semiconductor layer 320 and the second semiconductor layer 420 may be electrically insulated.

The lowermost part 321 of the first semiconductor layer 320 and the lowermost part 421 of the second semiconductor layer 420 may be located above the lowermost part 346 of the first element isolation layer 345.

As described above, the first semiconductor layer 320 may have the first conductivity type, and the second semiconductor layer 420 may have the second conductivity type. For example, as illustrated in FIG. 3, the first semiconductor layer 320 may be a P-type and the second semiconductor layer 420 may be an N-type.

Figure 4:
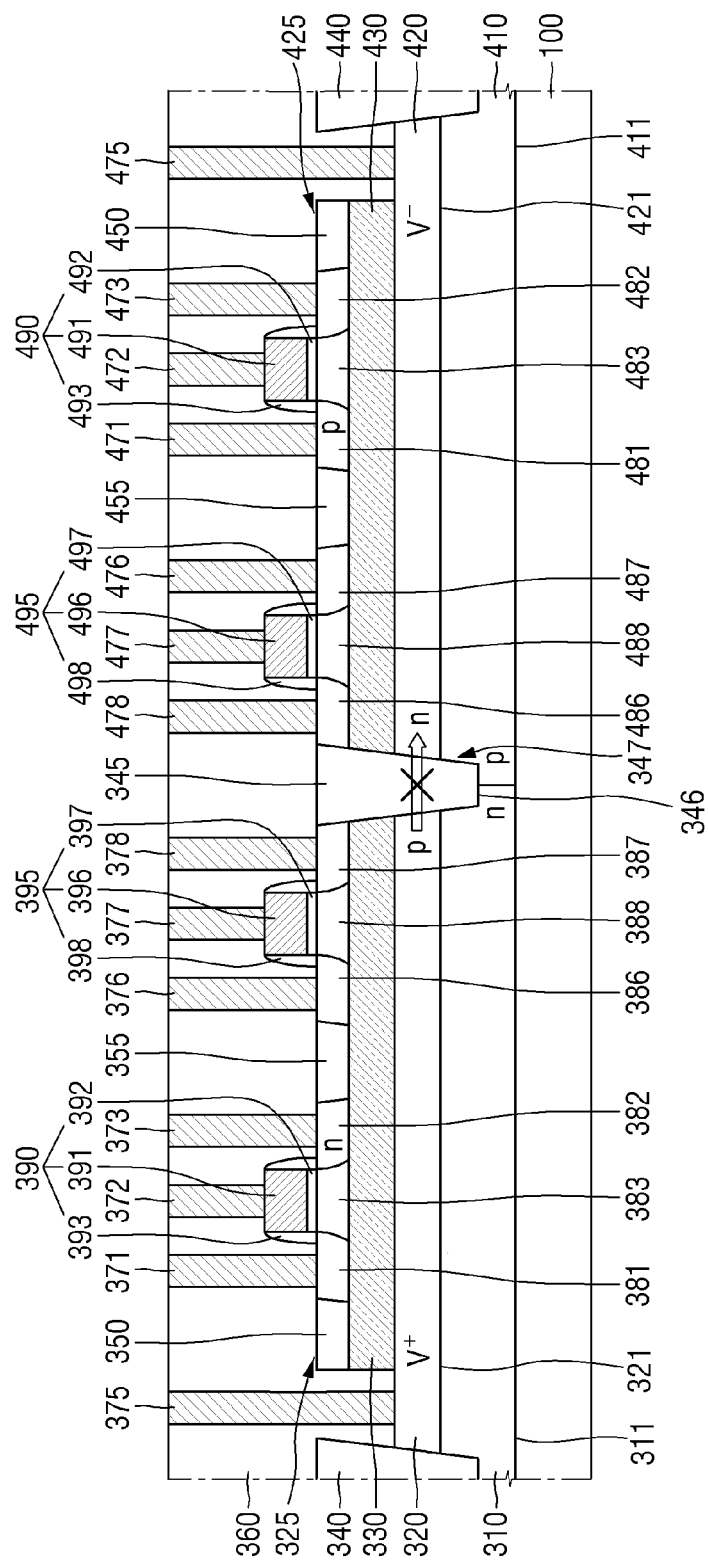
FIG. 4 is a cross-sectional view illustrating the operation of the semiconductor device of FIG. 3.

FIG. 4 is a cross-sectional view for explaining the operation of the semiconductor device of FIG. 3.

Referring to FIG. 4, the first body bias voltage (V+) may be applied to the first semiconductor layer 320 by a first well contact 375 formed on the first semiconductor layer 320. Further, a second body bias voltage (V−) smaller than the first body bias voltage (V+) may be applied to the second semiconductor layer 420 by a second well contact 475 formed on the second semiconductor layer 420.

In the semiconductor device according to some embodiments of the present inventive concepts, the configuration in which even when the first body bias voltage (V+) applied to the first semiconductor layer 320 is higher than the second body bias voltage (V−) applied to the second semiconductor layer 420, no forward bias is formed between the first semiconductor layer 320 and the second semiconductor layer 420 is the same as the case of the semiconductor device described above described using FIG. 2.

As a result, the magnitude of the body bias voltage applied to the first semiconductor layer 320 may not be limited by the magnitude of the body bias voltage applied to the second semiconductor layer 420.

The threshold voltage of the semiconductor device illustrated in FIG. 3 may be higher than the threshold voltage of the semiconductor device illustrated in FIG. 1. That is, the semiconductor device illustrated in FIG. 3 may be a regular threshold voltage cell, and the semiconductor device illustrated in FIG. 1 may be a lower threshold voltage cell, but the present inventive concepts are not limited thereto.

FIGS. 5 to 12 are intermediate step diagrams for explaining a method of fabricating a semiconductor device according to some embodiments of the present inventive concepts.

Figure 5:
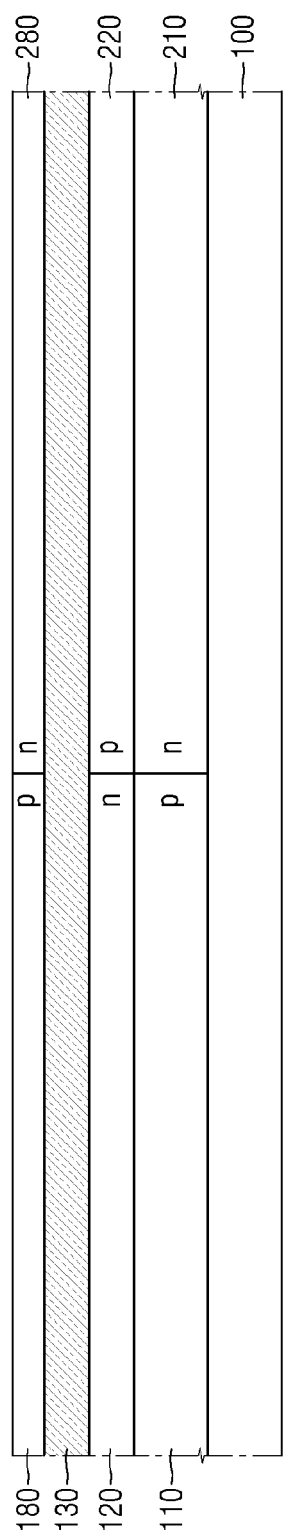
FIGS. 5 to 12 are intermediate step diagrams illustrating a method of fabricating a semiconductor device according to some embodiments of the present inventive concepts.

First, referring to FIG. 5, a substrate 100 is provided which includes a first impurity region 110, a second impurity region 210, a first semiconductor layer 120 and a second semiconductor layer 220 formed on the first and second impurity regions 110 and 210 respectively, a buried insulation layer 131 formed on the first and second semiconductor layers 120 and 220, and a third semiconductor layer 180 and a fourth semiconductor layer 280 formed on the buried insulation layer 131.

The first and second impurity regions 110 and 210 and the first and second semiconductor layers 120 and 220 may be formed by doping the substrate 100 with respective impurities. For example, each of the first impurity region 110 and the second impurity region 210 may be formed by doping the substrate 100 with the material of the first conductivity type and the material of the second conductivity type, and the material of the second conductive type and the material of the first conductivity type may be doped to form the first semiconductor layer 120 and the second semiconductor layer 220, respectively.

In some embodiments, the substrate 100 may be a P-type substrate, and the second impurity region 210 may be an N-well formed in the P-type substrate. Conversely, the substrate 100 may be an N-type substrate, and the first impurity region 110 may be a P-well formed in the N-type substrate.

In some embodiments of the present inventive concepts, the buried insulation layer 131 may be formed by oxidizing the surface of the substrate 100 on which the first semiconductor layer 120 and the second semiconductor layer 220 are formed.

In addition, although the substrate 100 may be formed by bonding the third semiconductor layer 180 and the fourth semiconductor layer 280 onto the semiconductor substrate on which the buried insulation layer 131 is formed, the inventive concepts are not limited thereto.

Figure 6:
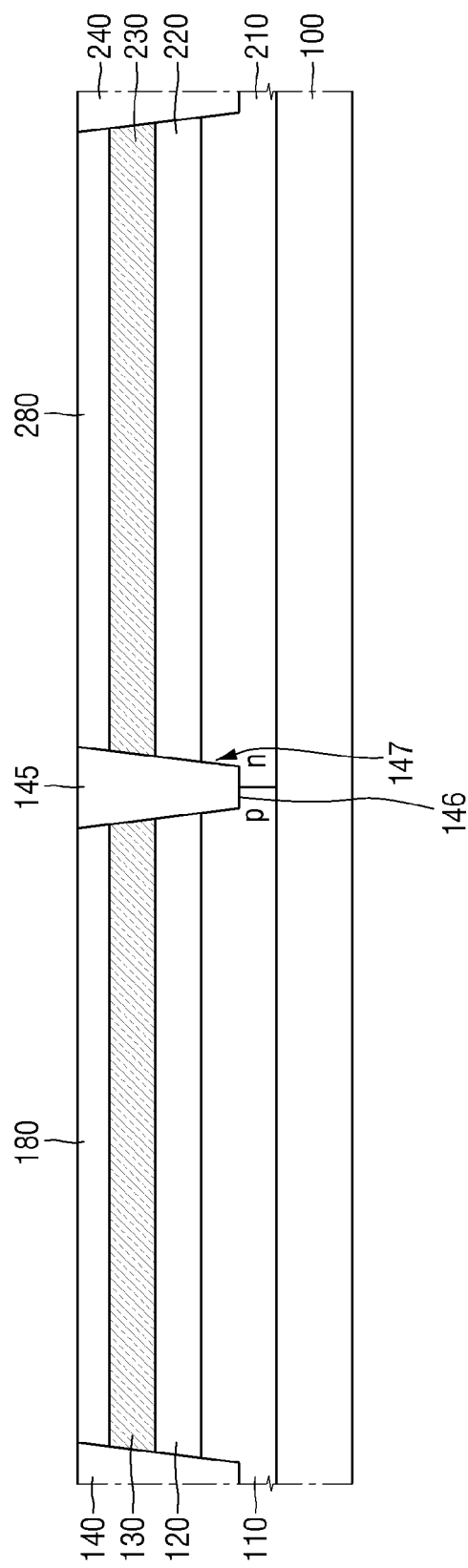

Subsequently, referring to FIG. 6, a trench 147 is formed in the substrate 100, and a first element isolation layer 145 which fills the trench 147 is formed. Formation of the trench 147 in the substrate 100 may include, for example, etching the substrate 100, using reactive ion etching, but the present inventive concepts are not limited thereto.

The trench 147 may be formed by etching the first impurity region 110 and the second impurity region 210. The first and second buried insulation layer 130 and 230 are formed by separating the buried insulation layer 131 in FIG. 5 as the trench 147 is formed. That is, as illustrated, the first semiconductor layer 120 and the second semiconductor layer 220, the first buried insulation layer 130 and the second buried insulation layer 230, and the third semiconductor layer 180 and the fourth semiconductor layer 280 may be completely separated as the trench 147 is formed. On the other hand, the first impurity region 110 and the second impurity region 210 may not be completely separated by the trench 147.

Subsequently, the trench 147 may be filled with an insulating material to form the first element isolation layer 145. Formation of the first element isolation layer 145 may include filling the trench 147 with, for example, at least one of silicon oxide ($SiO_2$), silicon nitride (SiN), silicon oxynitride (SiON), and combinations thereof.

Figure 7:
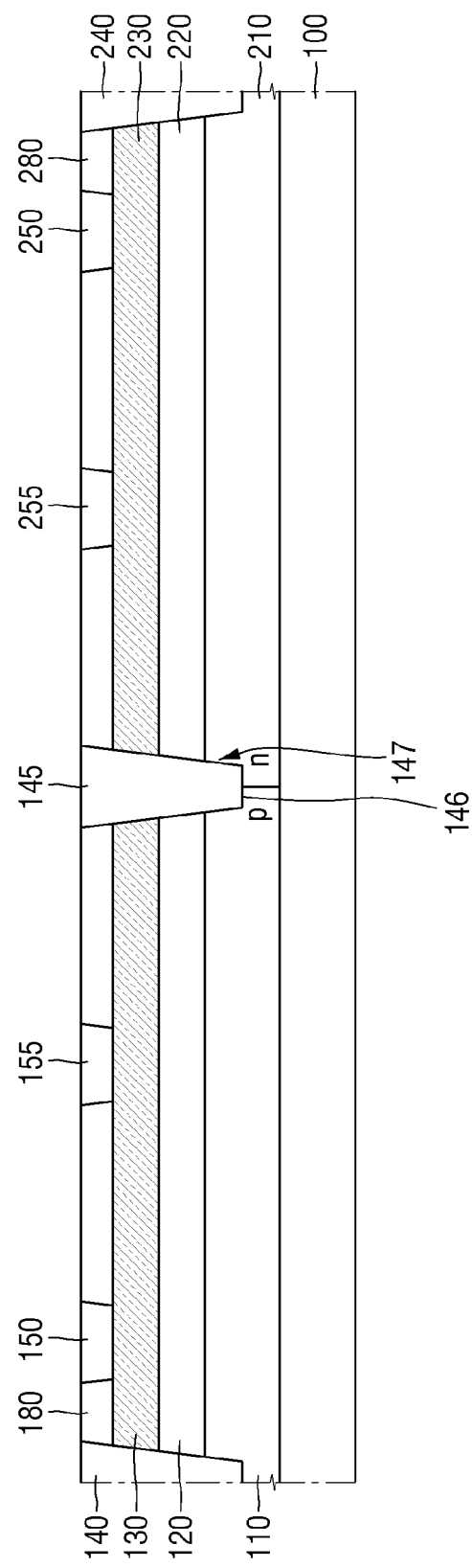

Referring to FIG. 7, second element isolation layers 150 and 155 are formed in the third semiconductor layer 180, and third element isolation layers 250 and 255 are formed in the fourth semiconductor layer 280.

Formation of the second element isolation layers 150 and 155 in the third semiconductor layer 180 may forming a trench which exposes the first buried insulation layer 130 in the third semiconductor layer 180, and filling the trench to form the second element isolation layers 150 and 155.

As illustrated in FIG. 7, the second element isolation layers 150 and 155 may be formed to be shallower than the first element isolation layer 145. Specifically, the first element isolation layer 145 has a depth to the first impurity region 110 or the second impurity region 210, and the second element isolation layers 150 and 155 may have a depth to the first buried insulation layer 130.

Further, third element isolation layers 250 and 255 may be formed in the fourth semiconductor layer 280. The third element isolation layers 250 and 255 may be formed at the same time as the second element isolation layers 150 and 155. Therefore, the third element isolation layers 250 and 255 may be formed substantially the same as the second element isolation layers 150 and 155.

As will be described later, a first transistor is formed between the second element isolation layers 150 and 155, and a second transistor is formed between the first element isolation layer 145 and the second element isolation layer 155.

Figure 8:
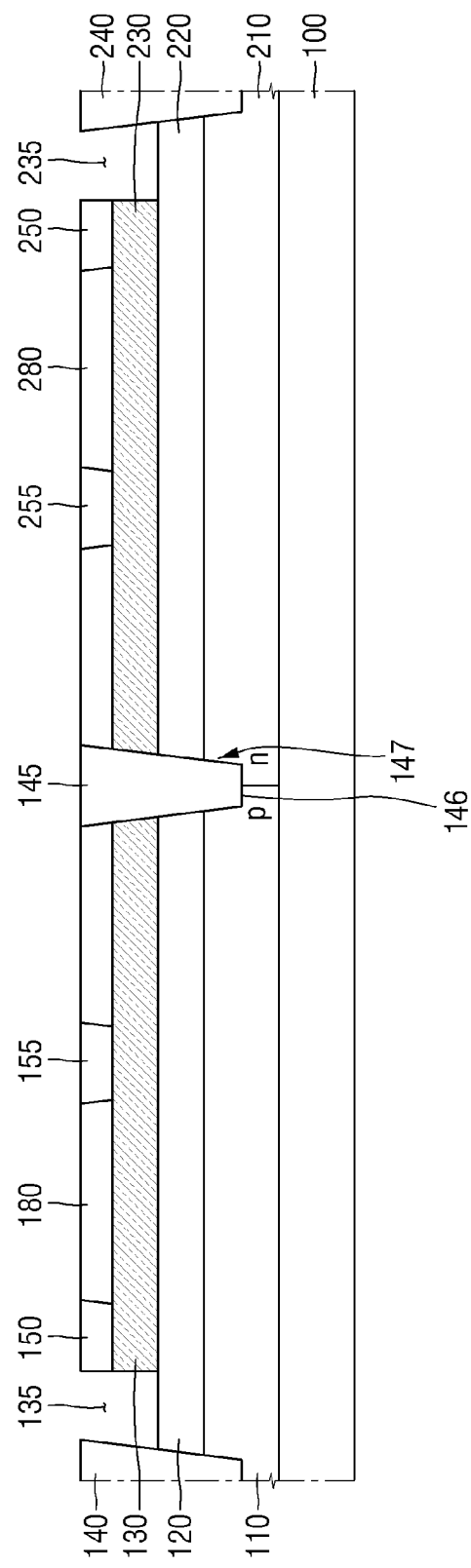

Referring to FIG. 8, trenches 135 and 235 which expose the first semiconductor layer 120 and the second semiconductor layer 220 are formed, respectively. The trench 135 may be formed by removing the third semiconductor layer 180 and the first buried insulation layer 130 at the same time. In addition, the trench 135 is formed between the first element isolation layer 140 and the second element isolation layer 150, and the trench 235 is formed between the first element isolation layer 240 and the third element isolation layer 250.

The sidewalls of the trench 135 may be defined by sidewalls of the first element isolation layer 140, the first buried insulation layer 130 and the second element isolation layer 150, but the present inventive concepts are not limited thereto. In some embodiments, the sidewalls of the trench 135 may be defined by materials of the third semiconductor layer 180 and the first buried insulation layer 130 remaining on the sidewalls of the first element isolation layer 140.

Figure 9:
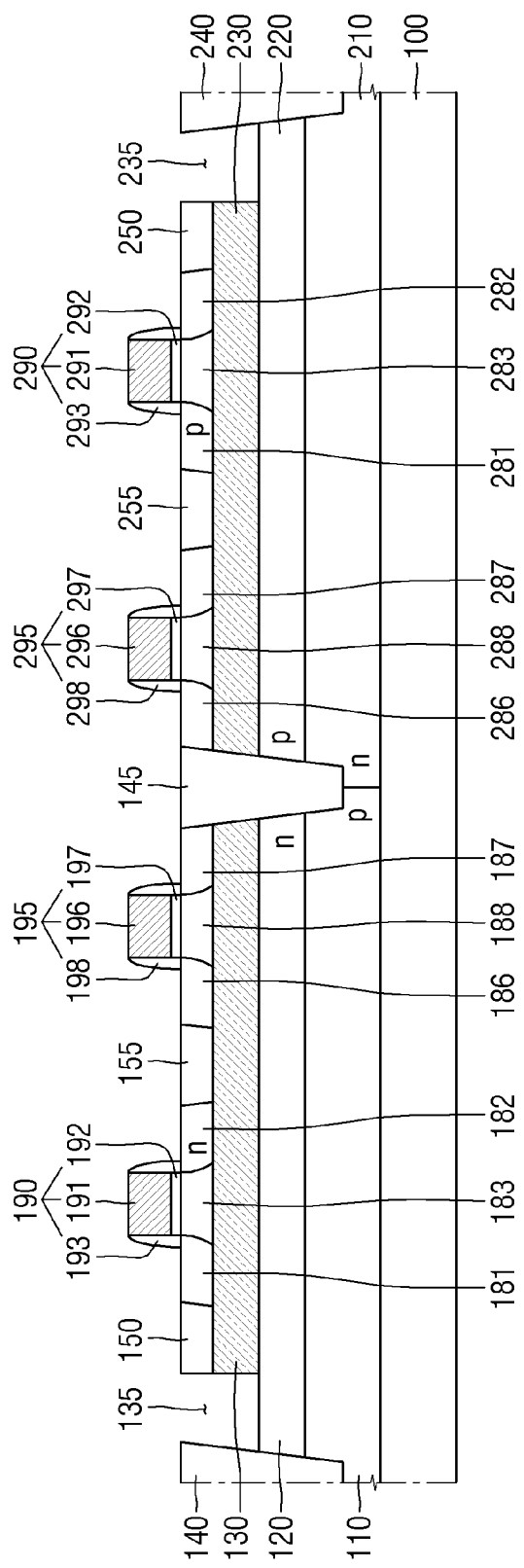

Referring to FIG. 9, a first transistor and a second transistor are formed on the first semiconductor layer 120, and a third transistor and a fourth transistor are formed on the second semiconductor layer 220.

Specifically, the first gate structure 190 and the second gate structure 195 may be formed on the third semiconductor layer 180, and first and second source regions 181 and 186, and the first and second drain regions 182 and 187 may be formed in the third semiconductor layer 180. Formation of the first and second source regions 181 and 186 or the first and second drain regions 182 and 187 may be an epitaxial growth from the third semiconductor layer 180, but the inventive concepts are not limited thereto. Or, after forming the first and second gate structures 190 and 195, by doping the third semiconductor layer 180 with impurities using the first and second gate structures 190 and 195 as a mask, the first and second source regions 181 and 186 or the first and second drain regions 182 and 187 may also be formed.

Formation of the first and second gate structures 190 and 195 may include forming an insulation layer and a conductive layer on the third semiconductor layer 180, patterning the insulation layer and the conductive layer to form a first and second gate insulation layer 192 and 197, and a first and second gate electrode 191 and 196 on the first and second channel region 183 and 188, forming a spacer film for covering the first and second gate electrode 191, 196, and etching the spacer film to form a first and second gate spacer 193 and 198.

Although the technique of forming the first and second gate structures 190 and 195 by the gate first method has been described above, the present inventive concepts are not limited thereto, and the first and second gate structures 190 and 195 may also be formed by the gate last method.

The formation of the third transistor and the fourth transistor may be carried out in a sequence similar to fabrication of the first transistor and the second transistor. However, the third transistor and the fourth transistor are not limited to those having the same configuration as the first transistor and the second transistor. The third transistor and the fourth transistor may be formed, for example, so as to include a separate constituent element to have a threshold value different from the first transistor or the second transistor.

Figure 10:
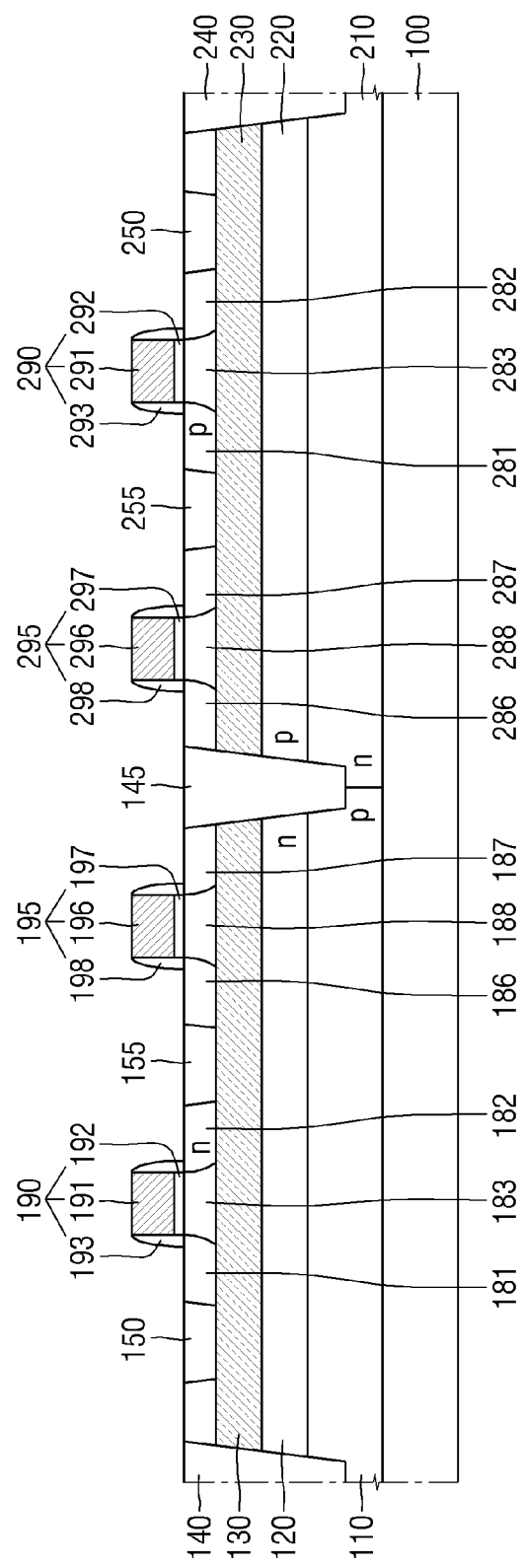

FIG. 10 is an intermediate step diagram for explaining a method of fabricating a semiconductor device according to some other embodiments of the present inventive concepts.

Referring to FIG. 10, a configuration in which first to fourth gate structures 190, 195, 290, and 295 are formed on the third semiconductor layer 180 and the fourth semiconductor layer 280 in a state in which the trenches 135 and 235 of FIG. 8 are not formed is illustrated.

The difference from the method of fabricating the semiconductor device described above with reference to FIGS. 8 and 9 is that the trenches 135 and 235 are not formed before the first to fourth gate structures 190, 195, 290, and 295 are formed on the third semiconductor layer 180 and the fourth semiconductor layer 280.

In some embodiments of the present inventive concepts, after forming the first to fourth gate structures 190, 195, 290, and 295, an interlayer insulation layer 160 may be formed, and a contact hole which exposes the first semiconductor layer 120 or the second semiconductor layer 220 may be formed. In other embodiments of the present inventive concepts, after forming the first to fourth gate structures 190, 195, 290, and 295, the trenches 135 and 235 may be formed, and then an interlayer insulation layer 160 for filling this may be formed.

Figure 11:
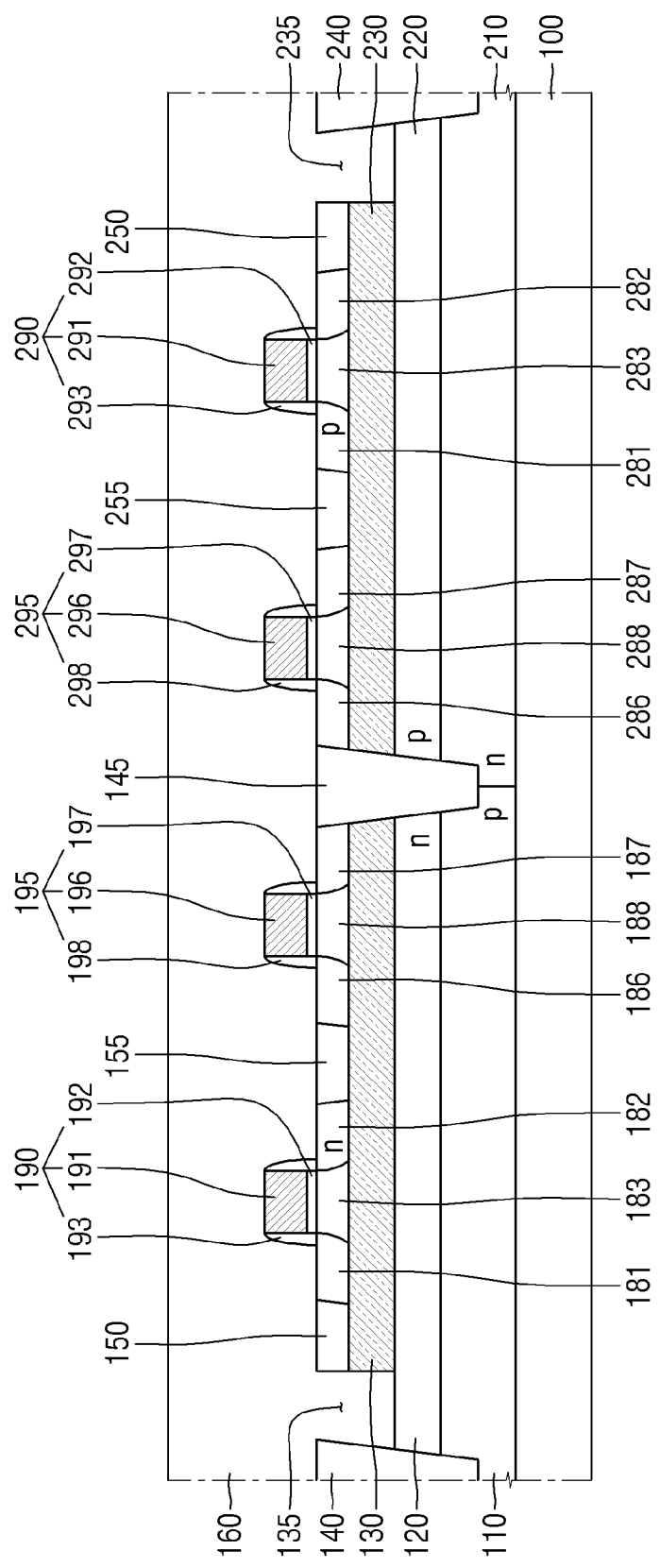

Referring to FIGS. 9 and 11 together, the interlayer insulation layer 160 is formed to cover the first to fourth transistors. The interlayer insulation layer 160 may be formed to fill the trenches 135 and 235.

The interlayer insulation layer 160 may be formed, for example, by a process such as CVD (Chemical Vapor Deposition), using at least one of silicon oxide, silicon nitride, silicon oxynitride and a low dielectric constant material having a dielectric constant lower than that of silicon oxide, but the inventive concepts are not limited thereto.

Figure 12:
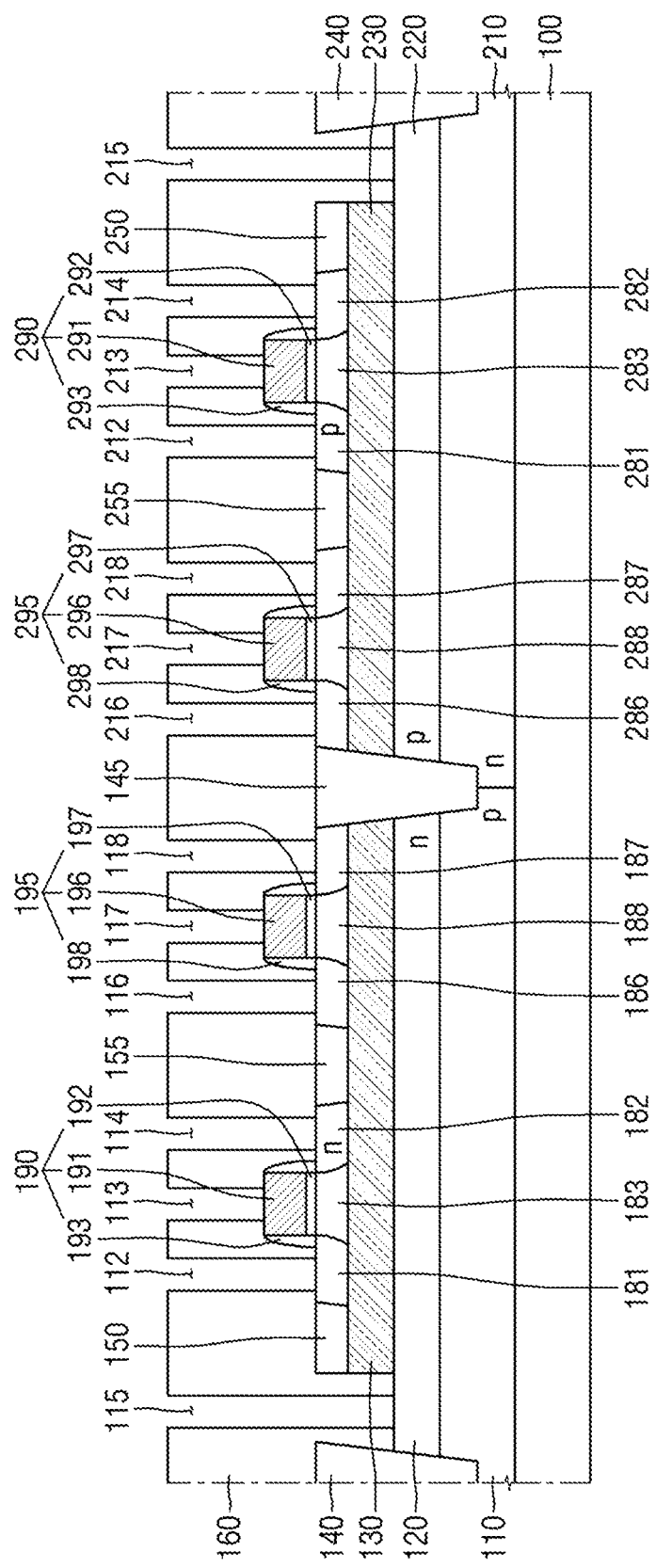

Referring to FIG. 12, the interlayer insulation layer 160 is etched to form the contact holes 112 to 118, and 212 to 218.

As illustrated in FIG. 12, the contact holes formed in the semiconductor device of the present inventive concepts may be divided into two types. There are contact holes 112 to 114, 116 to 118, 212 to 214, and 216 to 218 formed on the first to fourth transistors, and first and second well contact holes 115 and 215 formed on each of the first and second semiconductor layers 120 and 220.

The first well contact hole 115 is formed adjacent to the first transistor. The first element isolation layer 145 is not disposed between the first well contact hole 115 and the first transistor. A second element isolation layer 150 may be disposed between the first well contact hole 115 and the first transistor.

Next, referring to FIG. 1 again, the first and second well contact 175 and 275 are formed by filling the first and second well contact hole 115 and 215 with a conductive material. Further, the contacts 171 to 173, 176 to 178, 271 to 273, and 276 to 278 are formed by filling the contact holes 112 to 114, 116 to 118, 212 to 214, and 216 to 218, which are formed on the first to fourth transistors, with a conductive material.

In concluding the detailed description, those skilled in the art will appreciate that many variations and modifications can be made to the example embodiments without substantially departing from the principles of the present inventive concepts. Therefore, the disclosed example embodiments of the inventive concepts are used in a generic and descriptive sense only and not for purposes of limitation.

What is claimed is:

1. A semiconductor device comprising:
   a substrate;
   a first impurity region of a first conductivity type on the substrate;
   a second impurity region of a second conductivity type on the substrate to be adjacent to the first impurity region;
   a first single semiconductor layer of the second conductivity type on the first impurity region;
   a second single semiconductor layer of the first conductivity type on the second impurity region;
   a first buried insulation layer on the first single semiconductor layer;
   a second buried insulation layer on the second single semiconductor layer;
   a third semiconductor layer on the first buried insulation layer;
   a fourth semiconductor layer on the second buried insulation layer;
   a first transistor and a second transistor on the first single semiconductor layer, respectively;
   a third transistor on the second single semiconductor layer;
   a first element isolation layer which separates the second transistor and the third transistor; and
   a second element isolation layer which separates the first transistor and the second transistor and is shallower than the first element isolation layer,
   wherein the first transistor and the second transistor share the first single semiconductor layer as a common body region.

2. The semiconductor device of claim 1, further comprising:
   a fourth transistor on the second single semiconductor layer; and
   a third element isolation layer, shallower than the first element isolation layer, which separates the fourth transistor and the third transistor.

3. The semiconductor device of claim 2, wherein the third element isolation layer is in the fourth semiconductor layer.

4. The semiconductor device of claim 1, wherein the first element isolation layer completely separates the first single semiconductor layer and the second single semiconductor layer.

5. The semiconductor device of claim 1, wherein the first impurity region and the second impurity region are partially in contact with each other.

6. The semiconductor device of claim 1, wherein the second element isolation layer is in the third semiconductor layer.

7. The semiconductor device of claim 1, further comprising:
   a first well contact on the first single semiconductor layer exposed by the third semiconductor layer and the first buried insulation layer.

8. The semiconductor device of claim 7, further comprising:
   a second well contact on the second single semiconductor layer exposed by the fourth semiconductor layer and the second buried insulation layer.

9. The semiconductor device of claim 1, wherein a capacitor is formed, using the first single semiconductor layer and the third semiconductor layer as electrodes and using the first buried insulation layer as a dielectric.

10. The semiconductor device of claim 1, wherein the second element isolation layer is not between the first impurity region and the second impurity region.

11. The semiconductor device of claim 1, wherein the first transistor includes a first source/drain region,
    the second transistor includes a second source/drain region, and
    the second element isolation layer is between the first source/drain region and the second source/drain region.

12. The semiconductor device of claim 1, wherein the third semiconductor layer has the first conductivity type and the fourth semiconductor layer has the second conductivity type.

13. The semiconductor device of claim 1, wherein the third semiconductor layer has the second conductivity type and the fourth semiconductor layer has the first conductivity type.

14. A semiconductor device comprising:
    a substrate;
    a first impurity region of a first conductivity type and a second impurity region of a second conductivity type in contact with each other on the substrate;
    a first single semiconductor layer of the second conductivity type on the first impurity region;
    a second single semiconductor layer of the first conductivity type on the second impurity region;
    a buried insulation layer on the first single semiconductor layer and the second single semiconductor layer;
    a third semiconductor layer overlapping the first single semiconductor layer, and a fourth semiconductor layer overlapping the second single semiconductor layer on the buried insulation layer;
    a first element isolation layer in the third semiconductor layer;
    a first transistor and a second transistor on both sides of the first element isolation layer on the first single semiconductor layer; and
    a second element isolation layer which completely separates the first single semiconductor layer and the second single semiconductor layer,
    wherein the first transistor and the second transistor share the first single semiconductor layer as a common body region.

15. The semiconductor device of claim 14, further comprising:
   a third transistor on the second single semiconductor layer.

16. The semiconductor device of claim 15, further comprising:
   a third element isolation layer in the fourth semiconductor layer, and
   a fourth transistor on the second single semiconductor layer,
   wherein the third transistor is on one side of the third element isolation layer, and the fourth transistor is on the other side of the third element isolation layer.

17. The semiconductor device of claim 14, further comprising:
   a first well contact on the first single semiconductor layer exposed by the third semiconductor layer and the buried insulation layer.

18. The semiconductor device of claim 17, further comprising:
   a second well contact on the second single semiconductor layer exposed by the fourth semiconductor layer and the buried insulation layer.

19. A semiconductor device comprising:
   a substrate;
   a first impurity region of a first conductivity type on the substrate;
   a second impurity region of a second conductivity type on the substrate to be adjacent to the first impurity region;
   a first single semiconductor layer of the second conductivity type on the first impurity region;
   a second single semiconductor layer of the first conductivity type on the second impurity region;
   a first buried insulation layer on the first single semiconductor layer;
   a second buried insulation layer on the second single semiconductor layer;
   a third semiconductor layer on the first buried insulation layer;
   a fourth semiconductor layer on the second buried insulation layer;
   a first transistor on the first single semiconductor layer;
   a second transistor on the second single semiconductor layer;
   a first element isolation layer which separates the first transistor and the second transistor;
   a second element isolation layer in the third semiconductor layer shallower than the first element isolation layer; and
   a first well contact connected to the first single semiconductor layer, the first well contact not between the first transistor and the first element isolation layer; and
   a third transistor on the first single semiconductor layer and separated by the first transistor and the second element isolation layer,
   wherein the first transistor and the third transistor share the first single semiconductor layer as a common body region.

* * * * *